United States Patent
Jing et al.

(10) Patent No.: US 10,734,189 B2
(45) Date of Patent: Aug. 4, 2020

(54) ION IMPLANTATION AMOUNT ADJUSTMENT DEVICE AND METHOD, ION IMPLANTATION APPARATUS AND DETERMINATION METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hao Jing, Beijing (CN); Dongwoo Kang, Beijing (CN); Yongyi Fu, Beijing (CN); Chenliang Liu, Beijing (CN); Rujian Li, Beijing (CN); Kang Luo, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/323,418

(22) PCT Filed: Mar. 28, 2018

(86) PCT No.: PCT/CN2018/080897
§ 371 (c)(1),
(2) Date: Feb. 5, 2019

(87) PCT Pub. No.: WO2018/233337
PCT Pub. Date: Dec. 27, 2018

(65) Prior Publication Data
US 2019/0164718 A1    May 30, 2019

(30) Foreign Application Priority Data

Jun. 22, 2017   (CN) .......................... 2017 1 0483558

(51) Int. Cl.
*H01J 37/02*       (2006.01)
*H01J 37/244*     (2006.01)
(Continued)

(52) U.S. Cl.
CPC ............ *H01J 37/023* (2013.01); *H01J 37/05* (2013.01); *H01J 37/244* (2013.01);
(Continued)

(58) Field of Classification Search
USPC ............................................ 250/492.21, 397
See application file for complete search history.

(56) References Cited

U.S. PATENT DOCUMENTS 5,063,294 A * 11/1991 Kawata ................... H01J 37/09
                                                                    250/397
5,130,552 A *  7/1992 Bright ..................... H01J 37/05
                                                                    250/492.2
(Continued)

FOREIGN PATENT DOCUMENTS

CN     102891207 A      1/2013
CN     203983227 U    12/2014
(Continued)

OTHER PUBLICATIONS

First Office Action for Chinese Application No. 201710483558.3, dated Jun. 1, 2018, 7 Pages.
(Continued)

*Primary Examiner* — Kiet T Nguyen
(74) *Attorney, Agent, or Firm* — Brooks Kushman P.C.

(57) ABSTRACT

The present disclosure relates to an ion implantation amount adjustment device that includes: an adjuster configured to turn on or off an ion outlet of the ion implantation apparatus; and an actuator configured to control movement of the adjuster to adjust an opening degree of the ion outlet.

7 Claims, 4 Drawing Sheets

(51) Int. Cl.
    *H01J 37/317*  (2006.01)
    *H01J 37/05*  (2006.01)
(52) U.S. Cl.
    CPC . *H01J 37/3171* (2013.01); *H01J 2237/31701* (2013.01); *H01J 2237/31703* (2013.01)

(56) References Cited

U.S. PATENT DOCUMENTS

| | | | |
|---|---|---|---|
| 5,629,528 A | | 5/1997 | Jost et al. |
| 5,780,863 A | * | 7/1998 | Benveniste ......... H01J 37/3007 250/492.21 |
| 6,194,734 B1 | * | 2/2001 | Loomis ................ H01J 37/09 250/397 |
| 6,207,964 B1 | * | 3/2001 | McIntyre .............. H01J 37/09 250/397 |
| 2009/0283703 A1 | * | 11/2009 | Tamura ............... A61N 5/1048 250/492.3 |

FOREIGN PATENT DOCUMENTS

| | | |
|---|---|---|
| CN | 204167254 U | 2/2015 |
| CN | 205319120 U | 6/2016 |
| CN | 205428882 U | 8/2016 |
| CN | 107195518 A | 9/2017 |
| JP | S643948 A | 1/1989 |
| JP | 2016500901 A | 1/2016 |
| WO | 9323871 A1 | 11/1993 |

OTHER PUBLICATIONS

International Search Report and Written Opinion for Application No. PCT/CN2018/080897, dated Jun. 27, 2018, 11 Pages.
Extended European Search Report for European Patent Application No. ,18820941.5 dated Feb. 17, 2020, 64 pages.

* cited by examiner

ION IMPLANTATION AMOUNT ADJUSTMENT DEVICE AND METHOD, ION IMPLANTATION APPARATUS AND DETERMINATION METHOD

CROSS-REFERENCE TO RELATED APPLICATION APPLICATIONS

This application is the U.S. national phase of PCT Application No. PCT/CN2018/080897 filed on Mar. 28, 2018, which claims priority to Chinese Patent Application No. 201710483558.3 filed on Jun. 22, 2017, which are incorporated herein by reference in their entireties.

TECHNICAL FIELD

The present disclosure relates to the field of liquid crystal product manufacturing technologies, and in particular to an ion implantation amount adjustment device and method, an ion implantation apparatus and a determination method.

BACKGROUND

Ion implantation is an important process that effects performance of an organic light emitting diode (OLED) device. An amount of doping ion implantation determines a threshold voltage and contact resistance of a thin film transistor in the organic light emitting diode display (OLED TFT). An ion outlet of an ion implantation apparatus in the related art cannot adjust ion implantation amount.

SUMMARY

The technical solutions adopted in this present disclosure are as follow.

An ion implantation amount adjustment device applied to an ion implantation apparatus, includes: an adjuster configured to turn on or off an ion outlet of the ion implantation apparatus; and an actuator configured to control movement of the adjuster to adjust an opening degree of the ion outlet.

Further, the adjuster includes an adjustment plate disposed at the ion outlet; and the adjustment plate is a plate structure.

Further, the actuator includes: an electric motor; and a driving rod. One end of the driving rod is connected with and driven by the electric motor; and another end of the driving rod is connected with the adjustment plate in a transmission way.

Further, the another end of the driving rod is connected with an end of the adjustment plate through a rotation shaft; and another end of the adjustment plate is a free end.

Further, the adjuster includes two adjustment plates; the another end of the driving rod is connected with an end of each adjustment plate, thereby simultaneously controlling movement of the two adjustment plates; and another end of each adjustment plate is a free end.

Further, the adjuster includes two adjustment plate disposed at the ion outlet; the actuator includes two driving units that control the two adjustment plates, respectively. Each driving unit includes: an electric motor; and a driving rod. One end of the driving rod is connected with and driven by the electric motor; and another end of the driving rod is connected with the corresponding adjustment plate in a transmission way.

Further, the two adjustment plates are symmetrically disposed at the ion outlet.

The present disclosure further provides an ion implantation apparatus including: an ion outlet and the above ion implantation amount adjustment device. The adjuster of the ion implantation amount adjustment device is configured to turn on or off the ion outlet.

The present disclosure further provides an ion implantation amount adjustment method implemented with the above ion implantation amount adjustment device, including: controlling, by the actuator, movement of the adjuster; and detecting ion implantation amount and adjusting movement amount of the adjuster according to a detection result.

The present disclosure further provides an ion beam uniformity determination method implemented with the above ion implantation amount adjustment device, including: controlling, by the actuator, movement of the adjuster, thereby enabling an opening degree of the ion outlet to be a first opening degree; detecting ion implantation amount, thereby obtaining a first detection result; controlling, by the actuator, movement of the adjuster, thereby enabling the opening degree of the ion outlet to be a second opening degree; detecting ion implantation amount, thereby obtaining a second detection result; and determining ion beam uniformity according to whether the first detection result and the second detection result satisfy a preset requirement.

Further, the preset requirement includes an amount of ion implantation increases linearly as the opening degree of the ion outlet increases.

DETAILED DESCRIPTION

Hereinafter, the features and the advantages of the present disclosure will be clearly described with reference to the accompanying drawings and embodiments. The embodiments are only used to illustrate the present disclosure and are not intended to limit the protection scope of the present disclosure.

Figure 1:
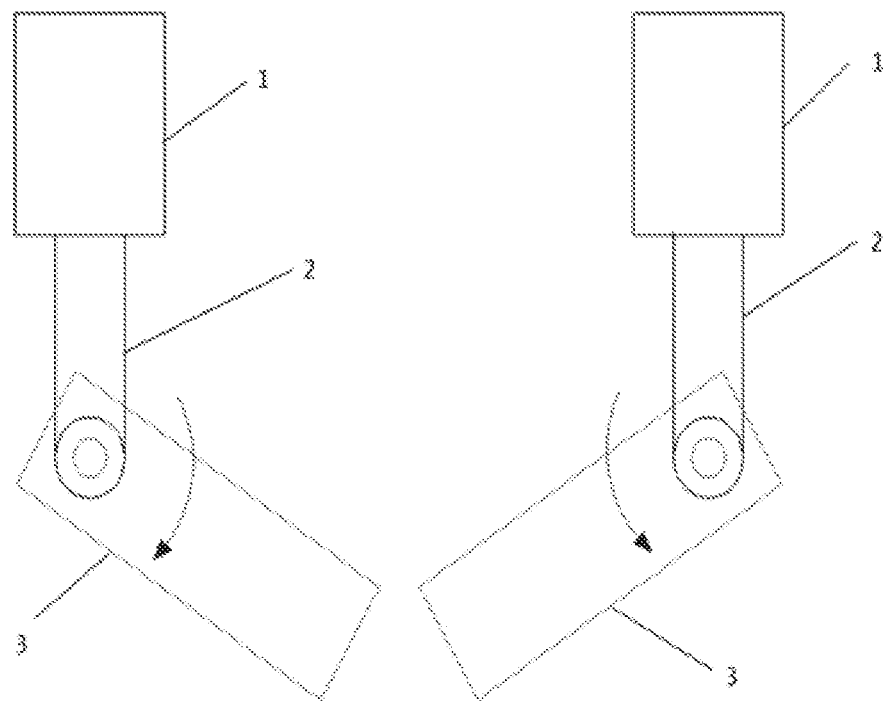
FIG. 1 is a schematic view of an ion implantation amount adjustment device according to an embodiment of the present disclosure.

As shown in FIG. 1, one embodiment of the present disclosure provides an ion implantation amount adjustment device which is applied to an ion implantation apparatus and includes: an adjuster configured to turn on or off an ion outlet; and an actuator configured to control movement of the adjuster to adjust an opening degree of the ion outlet.

The ion implantation amount adjustment device of this embodiment can turn off the ion outlet of the ion implantation apparatus, and can use the actuator to adjust the opening degree of the ion outlet from 0 degrees (i.e., the ion outlet is turned off). Further, the opening degree of the ion outlet can be flexibly adjusted to be an arbitrary opening degree, thereby adjusting amount of ions released from the ion outlet. Beneficial effects of the present disclosure include that the ion implantation amount can be flexibly adjusted.

Specific structures of the adjuster may be varied, as long as the adjuster can cover the ion outlet of the ion implantation apparatus and can adjust the opening degree of the ion outlet under control of the actuator. In this embodiment, the adjuster includes an adjustment plate 3 disposed at the ion outlet. The adjustment plate 3 is a plate structure.

The quantity of the adjustment plate 3 may be set according to actual needs. In an example of this embodiment, the adjuster includes one adjustment plate 3.

Specific structures of the actuator may be varied, as long as the actuator can control the adjuster and can control movement of the adjuster to adjust the opening degree of the ion outlet. In this embodiment, the actuator includes an electric motor 1 and a driving rod 2. One end of the driving rod 2 is connected with and driven by the electric motor 1. Another end of the driving rod 2 is connected with the adjustment plate 3 in a transmission way.

The another end of the driving rod 2 may be connected with an end of the adjustment plate 3 through a rotation shaft. Another end of the adjustment plate 3 is a free end.

In this embodiment, the adjustment plate 3 is rotated to turn on or off the ion outlet. Of course, the adjusting plate may also move in other movement modes such as a translation mode and a telescopic movement mode.

In this embodiment, the adjustment plate 3 is a rectangular structure. Of course, the adjustment plate may also be in other structural form such as a fan shape.

Figure 5:
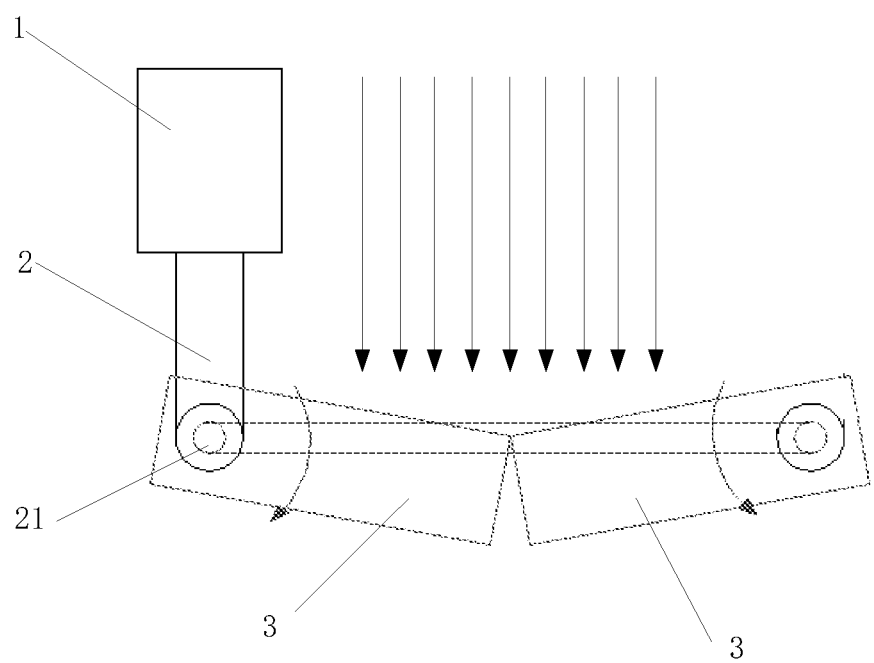
FIG. 5 is a schematic view of an ion implantation amount adjustment device according to an embodiment of the present disclosure.
Figure 6:
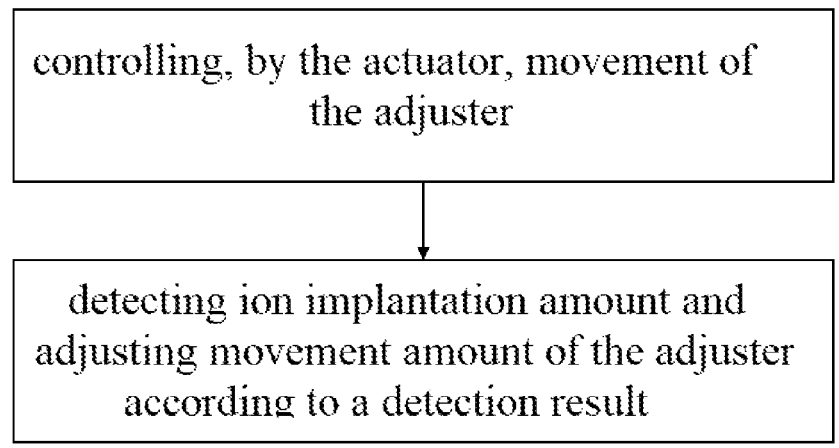
FIG. 6 is a flowchart of a method for adjusting an ion implantation amount adjustment method according to an embodiment of the present disclosure.

In another example of this embodiment, as shown in FIG. 5, the adjuster includes two adjustment plates 3 and one driving rod 2. The another end of the driving rod 2 is connected with an end of each adjustment plate 3 through a rotation shaft 21, thereby simultaneously controlling movement of the two adjustment plates 3. Another end of each adjustment plate 3 is a free end. The rotation shaft 21 is simply and schematically shown in FIG. 5. Specifically, the rotation shaft 21 may be implemented as a worm gear transmission structure or a helical gear transmission structure. For example, the worm gear transmission structure may be adopted to transfer motion and power between two intersecting shafts in space.

The actuator can use one driving rod 2 to simultaneously control movement of two adjustment plates 3, or use two driving rods 2 to independently control the two adjustment plates 3, respectively. In this embodiment, optionally, the actuator includes two driving units that control the two adjustment plates 3, respectively. Each driving unit includes the electric motor 1 and the driving rod 2. One end of the driving rod 2 is connected with the corresponding electric motor 1. Another end of the driving rod 2 is connected with the corresponding adjustment plate 3 in a transmission way.

Figure 2:
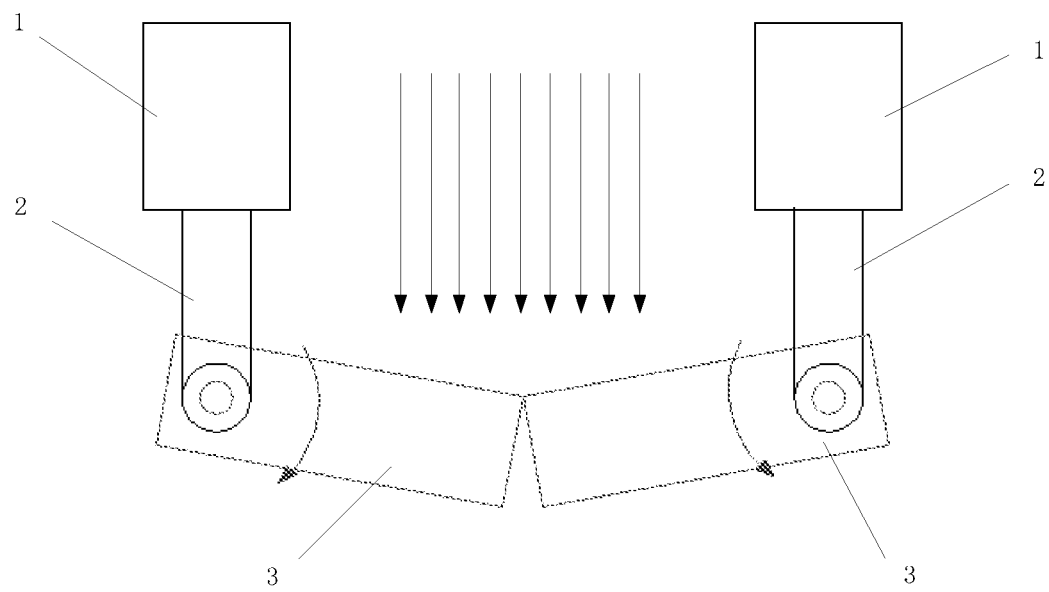
FIG. 2 is a schematic view of the ion implantation amount adjustment device with an ion outlet being adjusted to be in a first status according to an embodiment of the present disclosure.
Figure 3:
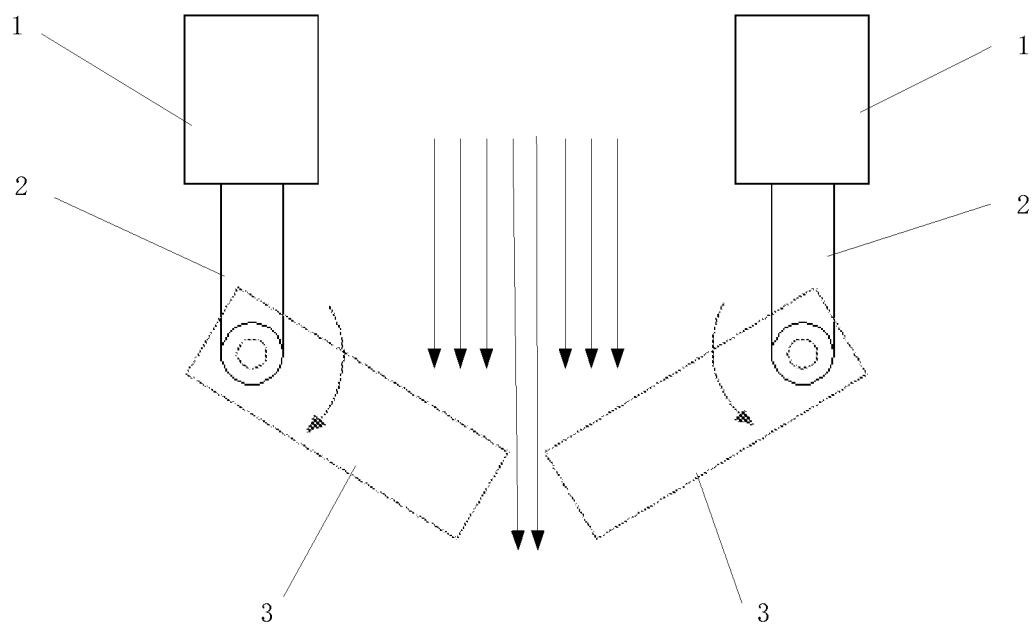
FIG. 3 is a schematic view of the ion implantation amount adjustment device with the ion outlet being adjusted to be in a second status according to an embodiment of the present disclosure.
Figure 4:
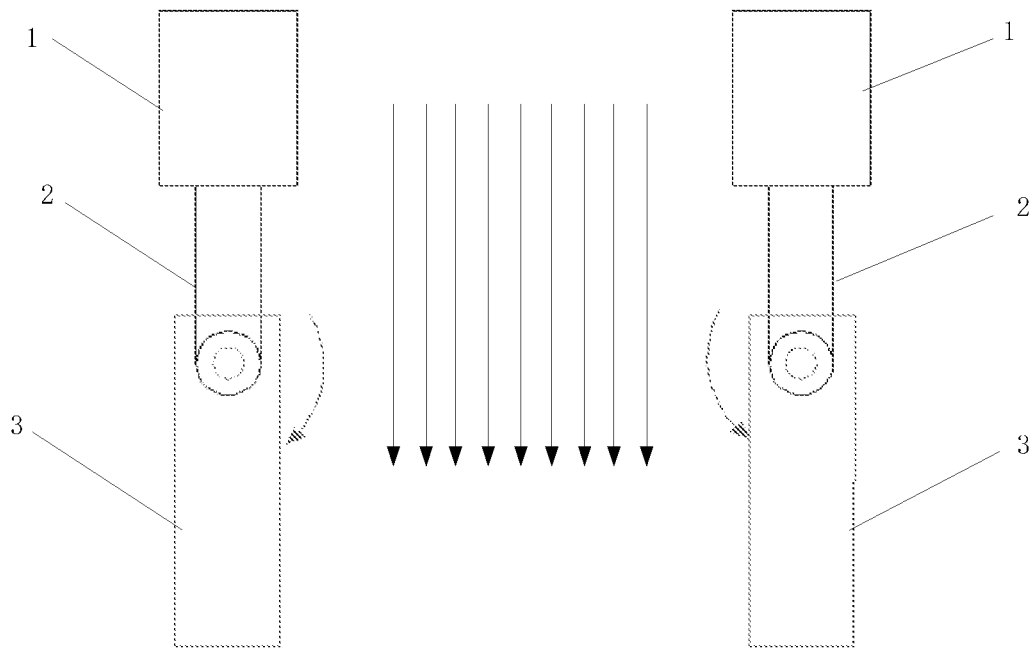
FIG. 4 is a schematic view of the ion implantation amount adjustment device with the ion outlet being adjusted to be in a third status according to an embodiment of the present disclosure.

FIG. 2 is a schematic view showing a state in which the adjustment plates 3 close the ion outlet. At this point, there is contact between the two adjustment plates 3, i.e., a distance between the free ends of the two adjustment plates 3 is 0 and ions cannot flow out through the ion outlet. FIG. 3 is a schematic view showing a state in which the two adjustment plates 3 are rotated by a preset angle under control of the actuator. Under control of the actuator, the two adjustment plates 3 are rotated to enable the opening degree of the ion outlet to be greater than 0 degrees, and then some ions can pass through the ion outlet. Vertical arrows represent ion beams, and curved arrows represent rotation directions of corresponding adjustment plates 3. FIG. 4 is a schematic view showing a state in which the two adjustment plates 3 are rotated until the ion outlet is fully open. At this point, all ions can pass through the ion outlet.

In this embodiment, the two adjustment plates 3 are symmetrically disposed at the ion outlet of the ion implantation apparatus. FIG. 3 shows that intermediate ion beams can pass through between the two adjustment plates 3, and it is not limited to this in actual use, ion beams in a preset region may be enabled to pass through between the two adjustment plates 3 according to actual needs.

In this embodiment, the ion implantation amount adjustment device can flexibly adjust the ion implantation amount by means of using the electric motor 1 to drive the adjustment plate 3.

One embodiment of the present disclosure further provides an ion implantation apparatus that includes the above ion implantation amount adjustment device.

One embodiment of the present disclosure further provides an ion implantation amount adjustment method which is implemented with the above ion implantation amount adjustment device. The method includes: controlling, by the actuator, movement of the adjuster; detecting ion implantation amount and adjusting movement amount of the adjuster according to a detection result.

The movement amount of the adjuster may be adjusted according to required ion implantation amount, thereby adjusting the opening degree of the ion outlet.

In one embodiment, the ion implantation amount can be detected through an ion implantation amount detection device in the related art.

One embodiment of the present disclosure further provides an ion beam uniformity determination method which is implemented with the above ion implantation amount adjustment device. The method includes:

controlling, by the actuator, movement of the adjuster, thereby enabling the opening degree of the ion outlet to be a first opening degree;

detecting ion implantation amount, thereby obtaining a first detection result;

controlling, by the actuator, movement of the adjuster, thereby enabling the opening degree of the ion outlet to be a second opening degree;

detecting ion implantation amount, thereby obtaining a second detection result; and determining ion beam uniformity according to whether the first detection result and the second detection result satisfy a preset requirement.

Uniformity of ions in a longitudinal direction (ion beam) and ion beam morphology can be guaranteed by adjusting the opening degree of the ion outlet. The first detection result and the second detection result may be obtained when one adjustment plate is controlled to move at a preset speed or two adjustment plates are controlled to move simultaneously. The ion beam uniformity may be determined according to whether the first detection result and the second detection result satisfy the preset requirement. The preset requirement includes that as the opening degree of the ion outlet increases, the amount of ion implantation increases linearly, which indicates that the ion implantation is uniform. Or, the two adjustment plates are controlled to move separately, then the obtained first detection result is compared with the second detection result; and the preset requirement includes that when the movement amounts of the two adjustment plates are the same, the obtained first detection result and second detection result are the same, which indicates that the ion implantation is uniform.

The ion beam uniformity determination method is described in details hereinafter with several examples.

When the adjuster includes two adjustment plates 3 and the two adjustment plates 3 are symmetrically disposed at the ion outlet, the ion beam uniformity determination method specifically includes:

controlling, by the actuator, one adjustment plate 3 to rotate by a preset angle to a first position, thereby enabling the opening degree of the ion outlet to be a first opening degree;

detecting ion implantation amount, thereby obtaining a first detection result which includes a first ion implantation amount;

controlling, by the actuator, another adjustment plate 3 to rotate by a preset angle to a second position, thereby enabling the opening degree of the ion outlet to be a second opening degree;

detecting ion implantation amount, thereby obtaining a second detection result which includes a second ion implantation amount;

determining that ion beams are injected uniformly through the ion outlet between the first position and the second position, when the first detection result and the second detection result satisfy a preset requirement, i.e., the first ion implantation amount is equal to the second ion implantation amount in case that the two adjustment plates 3 rotate by the same angle and the first opening degree is equal to the second opening degree but ions are emitted from different regions; otherwise, determining that ion beams are not injected uniformly through the ion outlet between the first position and the second position. In case that the first ion implantation amount is greater than the second ion implantation amount, it is needed to increase ion beams in an ion implantation region corresponding to the second detection result (or reduce ion beams in an ion implantation region corresponding to the first detection result). In case that the second ion implantation amount is greater than the first ion implantation amount, it is needed to increase ion beams in an ion implantation region corresponding to the first detection result (or reduce ion beams in an ion implantation region corresponding to the second detection result). By taking this as an example, it is possible to continue to compare detection results when the corresponding adjustment plate is rotated by other angles with a judgment result being used as a basis for adjusting uniformity of the ion beams.

When the adjuster includes two adjustment plates and the actuator simultaneously controls movement of the two adjustment plates by enabling the another end of the driving rod to be connected with an end of each adjustment plate through a rotation shaft, the ion beam uniformity determination method specifically includes:

controlling, by the actuator, the two adjustment plates to simultaneously rotate by a first preset angle, thereby enabling the opening degree of the ion outlet to be a first opening degree;

detecting ion implantation amount, thereby obtaining a first detection result which includes a third ion implantation amount;

controlling, by the actuator, the two adjustment plates to continue simultaneously rotating by a certain angle, thereby enabling the opening degree of the ion outlet to be a second opening degree which is different from the first opening degree;

detecting ion implantation amount, thereby obtaining a second detection result which includes a fourth ion implantation amount; and determining ion beam uniformity according to whether the first detection result and the second detection result satisfy a preset requirement. The preset requirement includes that variation between the third ion implantation amount and the fourth ion implantation amount changes linearly.

It should be noted that the angle by which the two adjustment plates simultaneously rotate for the second time, may be any angle that enables the second opening degree to be different from the first opening degree.

The foregoing are optional embodiments of the present disclosure. It should be noted that, for persons having ordinary skill in the art, various improvements and retouches, which are made without departing from the principle of the present disclosure, should be covered by the present disclosure.

What is claimed is:

1. An ion implantation amount adjustment device applied to an ion implantation apparatus, comprising:
   an adjuster configured to turn on or off an ion outlet of the ion implantation apparatus; and
   an actuator configured to control movement of the adjuster to adjust an opening degree of the ion outlet;
   wherein the adjuster includes an adjustment plate disposed at the ion outlet and the adjustment plate is a plate structure;
   wherein the actuator includes an electric motor and a driving rod;
   wherein one end of the driving rod is connected with and driven by the electric motor; and another end of the driving rod is connected with the adjustment plate in a transmission way;
   wherein the adjuster includes two adjustment plates; the another end of the driving rod is connected with an end of each adjustment plate through a rotation shaft to simultaneously control movement of the two adjustment plates; and another end of each adjustment plate is a free end;
   wherein the another end of the driving rod is connected with an end of the rotation shaft and the end of one of the two adjustment plates; and another end of the rotation shaft is connected with the end of the other adjustment plate.

2. The ion implantation amount adjustment device of claim 1, wherein the two adjustment plates are symmetrically disposed at the ion outlet.

3. An ion implantation apparatus comprising:
   an ion outlet;
   the ion implantation amount adjustment device of claim 1;
   wherein the adjuster of the ion implantation amount adjustment device is configured to turn on or off the ion outlet.

4. An ion implantation amount adjustment method implemented with the ion implantation amount adjustment device of claim 1, comprising:
   controlling, by the actuator, movement of the adjuster; and
   detecting ion implantation amount and adjusting movement amount of the adjuster according to a detection result.

5. An ion beam uniformity determination method implemented with the ion implantation amount adjustment device of claim 1, comprising:
   controlling, by the actuator, movement of the adjuster, thereby enabling an opening degree of the ion outlet to be a first opening degree;
   detecting ion implantation amount, thereby obtaining a first detection result;
   controlling, by the actuator, movement of the adjuster, thereby enabling the opening degree of the ion outlet to be a second opening degree;
   detecting ion implantation amount, thereby obtaining a second detection result; and
   determining ion beam uniformity according to whether the first detection result and the second detection result satisfy a preset requirement.

6. The ion beam uniformity determination method of claim 5, wherein the preset requirement includes an amount of ion implantation increases linearly as the opening degree of the ion outlet increases.

7. The ion implantation amount adjustment device of claim 1, wherein the rotation shaft is a worm gear or a helical gear.

\* \* \* \* \*